United States Patent
Ahn et al.

(10) Patent No.: US 12,282,618 B2
(45) Date of Patent: Apr. 22, 2025

(54) DISPLAY APPARATUS

(71) Applicant: LG Display Co., Ltd., Seoul (KR)

(72) Inventors: Taejoon Ahn, Paju-si (KR); Bongki Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/382,711

(22) Filed: Oct. 23, 2023

(65) Prior Publication Data

US 2024/0134472 A1  Apr. 25, 2024
US 2024/0231519 A9  Jul. 11, 2024

(30) Foreign Application Priority Data

Oct. 25, 2022  (KR) .................. 10-2022-0138552

(51) Int. Cl.
*G06F 3/041* (2006.01)
*G06F 3/044* (2006.01)
*G09G 3/3225* (2016.01)

(52) U.S. Cl.
CPC ........ *G06F 3/0412* (2013.01); *G06F 3/04164* (2019.05); *G06F 3/0445* (2019.05); *G06F 3/0446* (2019.05); *G09G 3/3225* (2013.01)

(58) Field of Classification Search
CPC .. G06F 3/0412; G06F 3/04164; G06F 3/0445; G06F 3/0446; G09G 3/3225; G09G 2300/0819; G09G 2300/0842; G09G 2300/0861; G09G 2354/00; H10K 59/40
See application file for complete search history.

(56) References Cited

U.S. PATENT DOCUMENTS

| | | | |
|---|---|---|---|
| 2017/0090661 A1* | 3/2017 | Kim | H10K 59/40 |
| 2018/0314372 A1* | 11/2018 | Lee | G06F 3/0412 |
| 2018/0323240 A1* | 11/2018 | Won | G09G 3/3241 |
| 2019/0129551 A1* | 5/2019 | Lee | G02F 1/1345 |
| 2019/0131572 A1* | 5/2019 | Gwon | G09G 3/3225 |
| 2020/0350512 A1 | 11/2020 | Guo et al. | |
| 2021/0026477 A1* | 1/2021 | Lee | H10K 59/8722 |
| 2021/0034185 A1* | 2/2021 | Kim | G06F 3/0446 |
| 2021/0143366 A1* | 5/2021 | Park | H10K 59/879 |
| 2021/0200358 A1 | 7/2021 | Kim et al. | |
| 2021/0200360 A1* | 7/2021 | Lee | H10K 50/844 |
| 2021/0200361 A1* | 7/2021 | Park | G06F 3/0412 |

FOREIGN PATENT DOCUMENTS

KR  10-2021-0083816 A  7/2021

* cited by examiner

*Primary Examiner* — Hong Zhou
(74) *Attorney, Agent, or Firm* — Morgan, Lewis & Bockius LLP

(57) ABSTRACT

A display apparatus may include a display area and a non-display area with a cutting surface, a light emitting diode, an encapsulation structure in the display area and a part of the non-display area, a touch structure on the encapsulation structure and comprising first and second touch dielectric layers and first and second electrodes, a routing line formed of a same layer and same material as the second touch electrode, and a second touch pad disposed on a first touch pad and formed of a same layer and same material as the routing line and the second touch electrode. The first touch pad may be formed of a same layer and same material as the source or drain electrode of a transistor. The second touch pad may be connected to the first touch pad via an opening in the at least one of the first and second touch dielectric layers.

25 Claims, 5 Drawing Sheets

DISPLAY APPARATUS

CROSS-REFERENCE TO RELATED APPLICATIONS

This application claims the benefit of and priority to Korean Patent Application No. 10-2022-0138552 filed on Oct. 25, 2022, the entirety of which is incorporated herein by reference for all purposes.

BACKGROUND

1. Technical Field

The present disclosure relates to a display apparatus.

2. Discussion of the Related Art

As the information society advances, the demand for display devices capable of displaying images is on the rise, and various types of display devices such as a liquid crystal display device or an organic light emitting display device are being utilized.

Display devices may be used for, among others, a computer monitor, a television, or a cellular phone, and a display device may employ, for example, an organic light emitting display (OLED) device which is a self-emitting device or a liquid crystal display (LCD) device which requires a separate light source.

As compared with the liquid crystal display device, the organic light emitting display apparatus does not use a separate light source, but uses a self-emitting light emitting diode. Thus, the organic light emitting display apparatus is emerging as a mainstream choice in the realm of display technology distinguished by its slim profile and superior image quality. Specifically, the light emitting diode may be formed on a flexible substrate to configure a screen in various forms that can be bent or curved in a manner suitable for its end products of various display apparatuses.

A display apparatus, such as an organic light emitting apparatus, may include a display panel and a plurality of components to perform various functions. The display apparatus may also include a plurality of periphery circuits to perform various types of additional functions, for example, touch sensing or fingerprint identifying functions. Some components may be disposed in the display area of the display panel, and other components may be disposed in the non-display area adjacent to the display area.

As the display apparatuses become diversified, users prefer a larger screen-to-device ratio for mobile products. In order to enhance, for example, the device's screen ratio, research endeavors are focused on implementing a narrow bezel design that can minimize the size of the non-display area relative to the display area.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

A display apparatus of one or more example embodiments of the present disclosure may provide a structure which changes a configuration of a touch unit to modify a shape of a touch routing line in a non-display area to reduce a width of an area in which a touch routing line is disposed, and provides a cut area (or a trimming area) of a display panel to be closer to the display area to reduce a width of the bezel. Further, a structure of minimizing the degradation of reliability according to a changed configuration of the touch unit may be provided.

A display apparatus according to one or more example embodiments of the present disclosure may include: a display area and a non-display area, wherein the non-display area includes a pad area; a plurality of pixels including a light emitting diode and a transistor in the display area, wherein the light emitting diode includes a first electrode, an emission element, and a second electrode, and wherein the transistor includes a gate electrode, a source electrode, and a drain electrode; an encapsulation structure which is disposed in the display area and a part of the non-display area; a touch structure, wherein at least a portion of the touch structure is disposed on the encapsulation structure, wherein the touch structure includes a plurality of touch dielectric layers and a plurality of touch conductive electrodes, wherein the plurality of touch dielectric layers includes a first touch dielectric layer and a second touch dielectric layer, and wherein the plurality of touch conductive electrodes includes a first touch conductive electrode and a second touch conductive electrode; a routing line formed of a same layer and of a same material as the second touch conductive electrode and connected to the second touch conductive electrode; and a touch pad disposed in the pad area and having a first touch pad and a second touch pad. The first and second touch dielectric layers may be disposed on the encapsulation structure. The second touch conductive electrode may be disposed on the first touch conductive electrode. The first touch pad may be formed of a same layer and of a same material as the source electrode of the transistor or the drain electrode of the transistor. The routing line may be extended and connected to the second touch pad. The second touch pad may be formed of a same layer and of a same material as the routing line and the second touch conductive electrode. At least one of the first and second touch dielectric layers may be extended to the pad area and may be disposed under the second touch pad. The second touch pad may be disposed on the first touch pad. The second touch pad may be connected to the first touch pad using at least an opening in the at least one of the first and second touch dielectric layers. The non-display area may include a cutting surface. Compared to the cutting surface, the touch pad may be disposed closer to the display area.

A display apparatus according to one or more example embodiments of the present disclosure may include: a display area and a non-display area, wherein the non-display area includes a pad area; a plurality of pixels including a light emitting diode and a transistor in the display area, wherein the light emitting diode includes a first electrode, an emission element, and a second electrode, and wherein the transistor includes a gate electrode, a source electrode, and a drain electrode; an encapsulation structure which is disposed in the display area and a part of the non-display area; a touch structure, wherein at least a portion of the touch structure is disposed on the encapsulation structure, wherein the touch structure includes a plurality of touch dielectric layers and a first touch conductive electrode, and wherein the plurality of touch dielectric layers includes a first touch dielectric layer and a second touch dielectric layer; a routing line disposed in the non-display area; and a touch pad disposed in the pad area and having a first touch pad and a second touch pad. The first and second touch dielectric layers may be disposed on the encapsulation structure. The first touch pad may be formed of a same layer and of a same material as the source electrode of the transistor or the drain electrode of the transistor. The routing line may be extended and connected to the second touch pad. The second touch pad may be formed of a same layer and of a same material as the routing line. At least one of the first and second touch dielectric layers may be extended to the pad area and may be disposed under the second touch pad. The second touch pad may be disposed on the first touch pad. The second touch pad may be connected to the first touch pad using at least an opening in the at least one of the first and second touch dielectric layers. The non-display area may include a cutting surface. Compared to the cutting surface, the touch pad may be disposed closer to the display area.

A display apparatus according to one or more example embodiments of the present disclosure may include: a substrate; a display area and a non-display area, where the non-display area includes a dam structure and a pad unit; a plurality of pixels including a light emitting diode formed by a first electrode, an emission unit, and a second electrode, where the first electrode, the emission unit, and the second electrode are disposed in the display area; an encapsulation unit which is disposed in the display area and a part of the non-display area; a touch unit which is disposed on the encapsulation unit and is configured by a first touch buffer layer, a plurality of touch connection electrodes, a second touch buffer layer, a touch insulating layer, a plurality of touch lines, and a touch protection layer; and a plurality of routing lines which electrically connects the plurality of touch lines to at least one of a plurality of touch pad electrodes disposed in the pad unit. The display apparatus may be configured so that the non-display area includes a cutting surface, the encapsulation unit is exposed at the cutting surface, and an end of the touch insulating layer may be spaced apart from the cutting surface toward the display area.

A display apparatus according to one or more example embodiments of the present disclosure may include: a display area and a non-display area; a plurality of pixels including a light emitting diode in the display area; an encapsulation unit which is disposed in the display area and a part of the non-display area, where the encapsulation unit is disposed on the light emitting diode; a touch insulating layer disposed on the encapsulation unit; and a plurality of touch electrodes disposed on the touch insulating layer. The display apparatus may be configured so that the non-display area includes a cutting surface, the encapsulation unit is exposed at the cutting surface, and an end of the touch insulating layer is spaced apart from the cutting surface toward the display area.

According to one or more example embodiments of the present disclosure, a width of an area in which a touch routing line is disposed is reduced, and a display panel is cut to be closer to the display area to minimize the bezel area.

Other examples, features, aspects and advantages will be, or will become, apparent to one with skill in the art upon examination of the drawings and detailed description herein. It is intended that all such examples, features, aspects and advantages be included within this description, be within the scope of the present disclosure, and be protected by the following claims. Nothing in this section should be taken as a limitation on the claims. Further examples, features, aspects and advantages are discussed below in conjunction with embodiments of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure. In the drawings.

Figure 1:
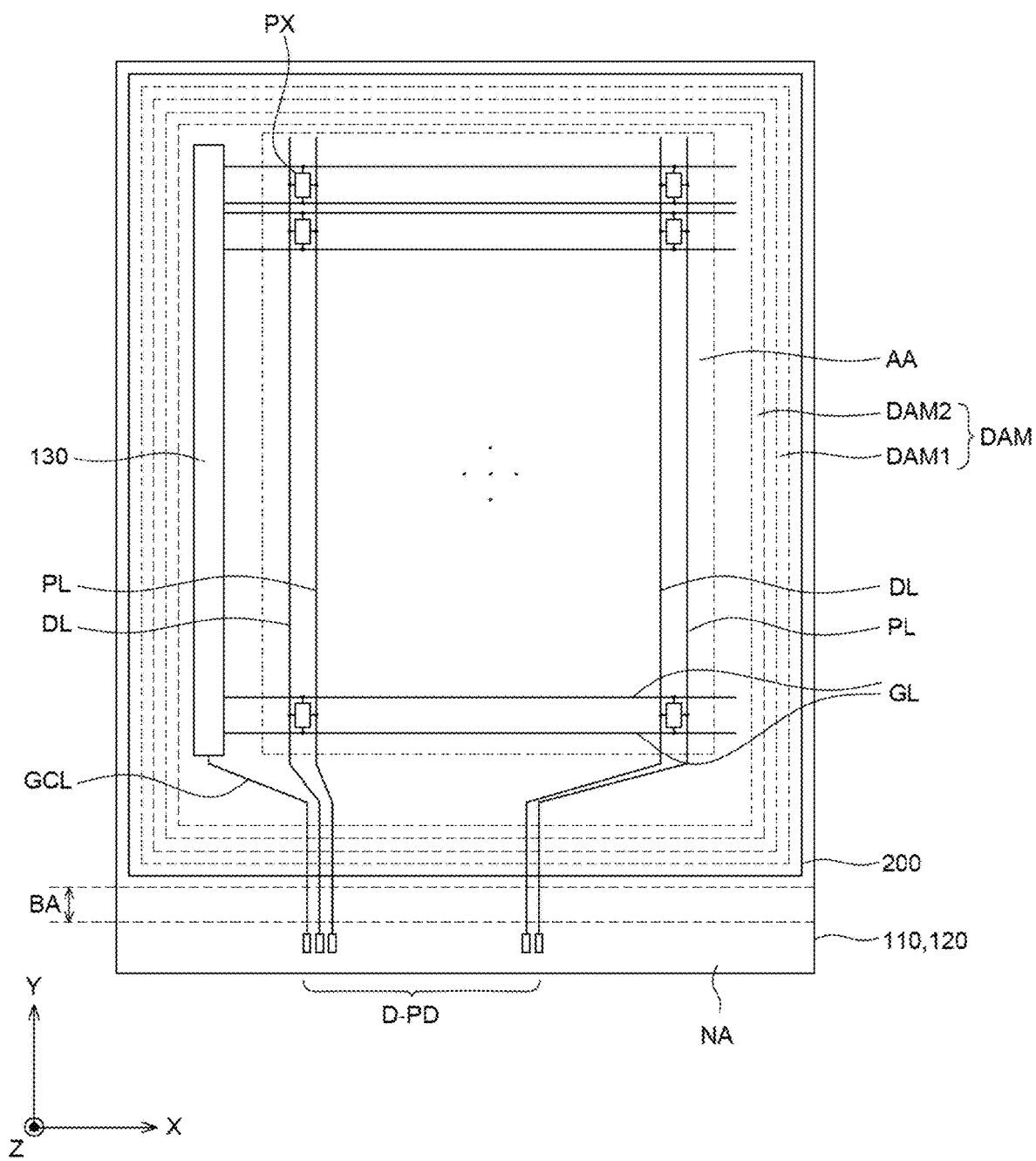
FIG. 1 is a plan view of a display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements, one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two elements (e.g., layers, films, regions, components, sections, or the like) is described, for example, using "on," "upon," "on top of," "over," "under," "above," "below," "beneath," "near," "close to," "adjacent to," "beside," "next to," "at or on a side of" or the like, one or more other elements may be located between the two elements unless a more limiting term, such as "immediate(ly)," "direct(ly)," or "close(ly)," is used. For example, when an element is described as being positioned "on," "on a top of," "upon," "on top of," "over," "under," "above," "below," "beneath," "near," "close to," "adjacent to," "beside," "next to," or "at or on a side of" another element, this description should be construed as including a case in which the elements contact each other directly as well as a case in which one or more additional elements are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, regions, components, sections, or the like), these elements should not be limited by these terms, for example, to any particular order, precedence, or number of elements. These terms are used only to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, component, unit, line, electrode, material, structure, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, component, unit, line, electrode, material, structure, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, component, unit, line, electrode, material, structure, or the like) is "provided in," "disposed on," "disposed in," "disposed under," or the like in another element may be understood as that (i) at least a portion of the element is provided in, disposed on, disposed in, disposed under, or the like in another element, (ii) that the element is provided in, disposed on, disposed in, disposed under, or the like in at least a portion of another element, (iii) that at least a portion of the element is provided in, disposed on, disposed in, disposed under, or the like in at least a portion of another element, or (iv) that the entirety of the element is provided in, disposed on, disposed in, disposed under, or the like in another element. The phrase "through" may be understood to be at least partially through or entirely through. The phase that an element (e.g., layer, film, component, unit, line, electrode, material, structure, or the like) "contacts," "is connected to," "overlaps," or the like with another element may be understood as (i) that at least a portion of the element contacts, is connected to, overlaps, or the like with another element, (ii) that the element contacts, is connected to, overlaps, or the like with at least a portion of another element, (iii) that at least a portion of the element contacts, is connected to, overlaps, or the like with a least a portion of another element, or (iv) that the entirety of the element contacts, is connected to, overlaps, or the like with another element. The phrase that an element (e.g., layer, film, component, unit, line, electrode, material, structure, process, or the like) is "configured by" another element may be understood as that the element is configured with, configured using, implemented with, or implemented using another element.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally. For example, the terms "first direction," "second direction," and the like, such as the terms "horizontal axis direction," "vertical axis direction," "X-axis direction," "Y-axis direction," and "Z-axis direction," should not be interpreted only based on a geometrical relationship in which the respective directions are parallel or perpendicular to each other, and may be meant as directions having wider directivities within the range within which the components of the present disclosure can operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, component, unit, line, electrode, material, structure, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "n-th" or "nth" may refer to "nnd" (e.g., 2nd where n is 2), or "nrd" (e.g., 3rd where n is 3), and n may be a natural number.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a codependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

In one or more examples, a display device may include a module such as a quantum dot (QD) module, an organic light emitting diode (OLED) module or a liquid crystal module (LCM) having a display panel and a driver for driving the display panel. In one or more other examples, a display device may include a set device (or a set apparatus) or a set electronic apparatus such as a notebook computer, a TV, a computer monitor, an equipment apparatus including an automotive apparatus or another type of apparatus for vehicles, or a mobile electronic device such as a smartphone or an electronic pad, which is a complete product (or a final product) including an LCM, an OLED module, and a QD module.

Therefore, in one or more examples, a display device may include a module, such as an LCM, an OLED module, and a QD module, and/or a set device, which is a final consumer device or an application product including the LCM, the OLED module, and the QD module.

In one or more examples, an LCM, an OLED module, and/or a QD module including a display panel and a driver may be referred to as a display device, and an electronic device, which is a final product including an LCM, an OLED module, and/or a QD module may be referred to as a set device. For example, a display device may include a display panel, such an LCM, an OLED module, or a QD module, and a source printed circuit board (PCB), which is a controller for driving the display panel. A set device may further include a set PCB, which is a set controller electrically connected to the source PCB to control the set device.

A display panel utilized in one or more example embodiments of the present disclosure may use any type of display panel, including a liquid crystal display panel, an organic light emitting diode (OLED) display panel, a quantum dot (QD) display panel, and/or an electroluminescent display panel. A display panel utilized in one or more embodiments is not limited to a specific display panel capable of bezel bending with a flexible substrate for an organic light emitting diode (OLED) display panel and a lower back plate support structure. Furthermore, a shape or a size of a display panel applied to (or implemented in) a display device according to one or more example embodiments of the present disclosure is not limited.

In an example where the display panel is an organic light emitting display panel, the display panel may include a plurality of gate lines, data lines, and pixels respectively provided at the intersections of the gate lines and the data lines. Furthermore, the display panel may include an array including a thin film transistor (TFT), which is an element for selectively applying a voltage to each of the pixels, a light emitting element layer (or an emission unit or a light emitting diode) on the array, and an encapsulation substrate (or an encapsulation layer or an encapsulation unit) disposed on the array to cover the light emitting element layer. The encapsulation substrate may protect the TFT and the light emitting element layer from an external impact and may prevent water or oxygen from penetrating into the light emitting element layer. Furthermore, a layer provided on the array may include an inorganic light emitting layer, for example, a nano-sized material layer, a quantum dot, or the like. Hereinafter, one or more example embodiments of a display apparatus with a structure which changes a configuration of a touch unit to modify a shape of a touch routing line in a non-display area to reduce a width of an area in which a touch routing line is disposed and provides a cut area (or a trimming area or a cutting surface) of a display panel to be closer to the display area to reduce a width of the bezel are described in more detail.

FIG. 1 is a plan view of a display apparatus according to an example embodiment of the present disclosure.

Referring to FIG. 1, a display apparatus 100 may include components on the substrate 110, such as a display panel 120, a gate driver 130, a data driver, an encapsulation unit 200, a dam structure DAM, and a touch unit. Further, the display apparatus 100 may include an optical function film including a polarization film attached to the touch unit, an optically clear adhesive (OCA), a cover substrate, and a passivation film.

The display apparatus 100 may include (or may be divided into) a display area AA and a non-display area NA. The display area AA may include the display panel 120, and the non-display area NA may include the gate driver 130 and the data driver. The substrate 110 may be divided into (or may be provided with, or may include) the display area AA and the non-display area NA.

The substrate 110 may be formed of glass or plastic, but is not necessarily limited thereto and may also be formed of a semiconductor material such as a silicon wafer.

The substrate 110 may also be formed with a plastic material having flexibility. For example, the substrate 110 may be formed by a single layer or a plurality of layers with a material such as polyimide (PI), polyethylene terephthalate (PET), polyethylene naphthalate (PEN), polycarbonate (PC), polyethersulfone (PES), polyarylate (PAR), polysulfone (PSF), and/or cyclic-olefin copolymer (COC), but is not limited thereto.

The display panel 120 has a structure in which a driving element unit including a plurality of pixel driving circuits disposed in the display area AA and a light emitting element unit including a plurality of light emitting diodes disposed in the display area AA are laminated.

In the display area AA, a plurality of data lines DL, a plurality of gate lines GL, and a plurality of power supply lines PL may be disposed. For example, the plurality of data lines DL may be disposed in rows or columns and the plurality of gate lines GL may be disposed in columns or rows. In the display panel 120, sub pixels PX may be disposed in a region defined by the plurality of data lines DL and the plurality of gate lines GL which intersect each other.

The plurality of gate lines GL disposed on the substrate 110 may include a plurality of scan lines and a plurality of emission control lines. The plurality of scan lines and the plurality of emission control lines may be lines which transmit different types of gate signals (e.g., a scan signal or an emission control signal) to a gate node of different types of transistors (e.g., a scan transistor or an emission control transistor).

The display area AA may be an area where a plurality of sub pixels PX is disposed to display images. Each of the plurality of sub pixels PX is an individual unit which emits light and in each of the plurality of sub pixels PX, a light emitting diode and a driving circuit may be formed. For example, in the plurality of sub pixels PX, a display element (or a light emitting diode) for displaying images and a circuit unit for driving the display element may be disposed. For example, when the display apparatus 100 is an organic light emitting display apparatus, the display element may include an organic light emitting element, and when the display apparatus 100 is a liquid crystal display device, the display element may include a liquid crystal element. The plurality of sub pixels PX may include a red sub pixel, a green sub pixel, a blue sub pixel and/or a white sub pixel, but is not limited thereto. In the example embodiment, an organic light emitting display apparatus having an organic light emitting diode as a display element is described herein.

The sub pixel PX of the display area AA may include a thin film transistor TFT or TR. The semiconductor layer of the thin film transistor in the sub pixel PX may be formed of a polycrystalline semiconductor material and/or an oxide semiconductor material, but is not limited thereto.

In the non-display area NA of the display panel 120, a line unit including a plurality of signal lines connected to the display area AA and a plurality of display pad electrodes D-PD may be disposed. The signal lines of the non-display area NA may include link lines connected to signal lines GL, DL, and PL of the display area AA. In the line unit provided at one side of the non-display area NA, the signal lines of the non-display area NA and the plurality of display pad electrodes D-PD for connecting the display driver are disposed.

The non-display area NA may be an area where no image is displayed and various wiring lines and driving integrated circuits (ICs) for driving the plurality of sub pixels PX disposed in the display area AA are disposed.

The non-display area NA may be an area which encloses the display area AA. For example, the non-display area NA may be an area extending from the display area AA or an area in which the plurality of sub pixels PX is not disposed, but is not limited thereto. The non-display area NA in which the image is not displayed may be a bezel area, or further include a bending area BA in which the substrate 110 is bent, but is not limited thereto.

The gate driver 130 which drives the plurality of gate lines GL of the display area AA may be disposed on one side or both sides of the non-display area NA of the display panel 120. The gate driver 130 including a plurality of thin film transistors may be formed in the driving element unit together with the thin film transistor array of the display area AA. The gate driver 130 is supplied with control signals from the display driver through the plurality of gate control lines GCL and the plurality of display pad electrodes D-PD disposed in the non-display area NA.

The display driver is mounted on the line unit in which the display pad electrode D-PD is located or mounted in a circuit film and may be connected to a plurality of display pad electrodes D-PD through an anisotropic conductive film. The circuit film may be any one of a chip on film (COF), a flexible printed circuit (FPC), and a flexible flat cable (FFC), but is not limited thereto. The display driver may include a timing controller, a gamma voltage generator, and a data driver.

The gate driver 130 may include a gate driving circuit (or a scan driving circuit) configured by a thin film transistor (TFT or TR). The gate driving circuit may be configured by a thin film transistor using a polycrystalline semiconductor material as a semiconductor layer, or configured by a thin film transistor using an oxide semiconductor material as a semiconductor layer. The gate driving circuit may also be configured by one pair of a thin film transistor having a polycrystalline semiconductor layer and a thin film transistor having an oxide semiconductor layer. When the same semiconductor material is used for the thin film transistors disposed in each of the non-display area NA and the display area AA, the thin film transistor may be simultaneously formed by the same process.

The gate driver 130 including the gate driving circuit may include a scan driving circuit which outputs scan signals to a plurality of scan lines which is one type of gate lines GL and an emission driving circuit which outputs emission control signals to a plurality of emission control lines which is another type of gate line.

The gate driving circuit may include a shift register and a level shifter, and as in the display apparatus 100 according to the example embodiment of the present disclosure, may be implemented as a gate in panel (GIP) type in a display panel 120 forming process to be directly disposed on the substrate 110. The gate driver 130 including the gate driving circuit may sequentially supply a scan signal of an on-driving voltage or an off-driving voltage to the plurality of gate lines GL.

The display driver may include a data driving circuit. The data driving circuit may be configured to be disposed in the non-display area NA in the substrate 110 or disposed at the outside of the substrate 110 to be connected to the display pad electrode D-PD disposed in the non-display area NA of the substrate 110. When a specific gate line GL is open by the gate driving circuit, the data driving circuit converts image data into an analog type data voltage to supply the converted data voltage to the data line DL.

The data line DL may be disposed so as to pass through the bending area BA and various data lines DL are disposed to be connected to the display pad electrode D-PD.

The bending area BA may be an area where the substrate 110 is bent. The substrate 110 is maintained in a flat state in an area excluding the bending area BA.

The encapsulation unit 200 disposed on the display panel 120 overlaps the entire display area AA and extends to the non-display area NA to overlap a dam structure DAM disposed in the non-display area NA. The encapsulation unit 200 may seal and protect the light emitting diode unit of the display panel 120. The encapsulation unit 200 may include a laminated structure of a plurality of inorganic encapsulation layers which blocks permeation of moisture and oxygen and at least one organic encapsulation layer which blocks inflow or floating of the particles. For example, the encapsulation unit 200 may have a structure in which an organic encapsulation layer having a high (or significant) thickness sufficient to cover the particles is disposed between the inorganic encapsulation layers having a low (or insignificant) thickness. The organic encapsulation layer may be a particle cover layer (PCL), but is not limited thereto.

The dam structure (or a dam unit) DAM is disposed in the non-display area NA to confine an end portion of the organic encapsulation layer of the encapsulation unit 200 to suppress the flowing-down or collapsing of the organic encapsulation layer. For example, the dam structure DAM may include a plurality of closed loop shaped dams DAM1 and DAM2 which enclose an area including the display area AA of the display panel 120 and the gate driver 130.

Figure 2:
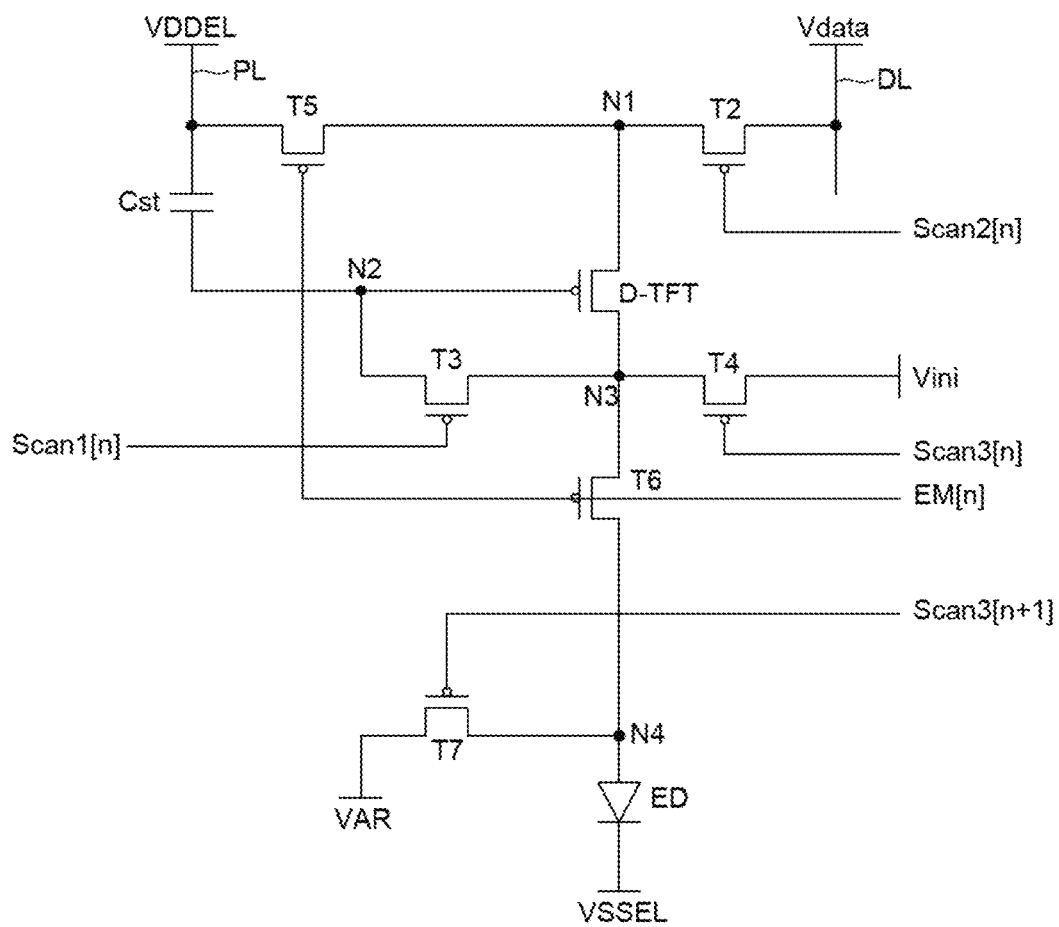
FIG. 2 is a circuit diagram illustrating a pixel driving circuit which drives one pixel in a display apparatus according to an example embodiment of the present disclosure.

FIG. 2 is a circuit diagram illustrating a pixel driving circuit which drives one pixel of a display apparatus according to an example embodiment of the present disclosure.

Referring to FIG. 2, in the pixel driving circuit according to the example embodiment of the present disclosure, a pixel (or sub pixel) PX may be configured by seven thin film transistors and one storage capacitor Cst. For example, one of seven thin film transistors is a driving thin film transistor D-TFT and the remaining may be switching thin film transistors T2 to T7 for internal compensation.

In the pixel driving circuit according to the example embodiment of the present disclosure, semiconductor layers of each of a driving thin film transistor D-TFT and a switching thin film transistor T3 adjacent to the driving thin film transistor D-TFT are configured by oxide semiconductor layers. At least one of the remaining switching thin film transistors may have a polycrystalline semiconductor layer which is configured as a semiconductor layer, but is not limited thereto. Each thin film transistor may be a P-type thin film transistor or an N-type thin film transistor.

The N-type thin film transistor may be formed of an oxide transistor in which the semiconductor layer is formed using a semiconductive oxide. For example, the oxide transistor may be a transistor having a channel formed from indium, gallium, zinc oxide, or semiconductive oxide, such as indium gallium zinc oxide (IGZO).

The P-type thin film transistor may be a polycrystalline transistor formed using semiconductor such as silicon as a semiconductor layer. For example, the polycrystalline transistor may be a transistor having a poly silicon channel formed using a low temperature process which may be referred to as a low temperature poly silicon (LTPS).

The oxide transistor has a characteristic having a leakage current lower than that of the polycrystalline transistor.

The second transistor T2 may be configured to switch the electrical connection between the first node N1 of the driving thin film transistor D-TFT and the data line DL. The first node N1 of the driving thin film transistor D-TFT may be a source node or a drain node of the driving thin film transistor D-TFT. An operation timing of the second transistor T2 may be controlled by a second scan signal Scan2 [n]. When a turn-on level of the second scan signal Scan2[n] is applied to the second transistor T2, a data voltage Vdata is applied to the first node N1 of the driving thin film transistor D-TFT.

The fifth transistor T5 may be configured to switch the electrical connection between the first node N1 of the driving thin film transistor D-TFT and the high potential driving voltage VDDEL line. An operation timing of the fifth transistor T5 may be controlled by the emission signal EM[n]. When a turn-on level of the emission signal EM[n] is applied to the fifth transistor T5, a high potential driving voltage VDDEL is applied to the first node N1 of the driving thin film transistor D-TFT.

In one example, the storage capacitor Cst is configured to apply a voltage corresponding to a voltage difference between VDDEL (i.e., the high potential driving voltage) and Vdata+Vth (i.e., a data voltage Vdata plus a threshold voltage Vth of the driving thin film transistor D-TFT). The storage capacitor Cst can provide the voltage difference as a driving voltage of the driving thin film transistor D-TFT. In another example, the storage capacitor Cst is configured to apply a voltage corresponding to a data voltage Vdata to the gate node of the driving transistor D-TFT during one frame period. The storage capacitor Cst may include one end electrically connected to the second node N2 of the driving thin film transistor D-TFT and the other end electrically connected to a high potential driving voltage VDDEL line. The second node N2 of the driving thin film transistor D-TFT may be a gate node of the driving thin film transistor D-TFT.

The third transistor T3 is electrically connected between the second node N2 and the third node N3 of the driving thin film transistor D-TFT. An operation timing of the third transistor T3 may be controlled by a first scan signal Scan1[n]. The third node N3 of the driving thin film transistor D-TFT may be the other node of a source node and a drain node of the driving thin film transistor D-TFT.

The third transistor T3 may be an oxide transistor. The oxide transistor may maintain a constant voltage level of the second node N2 of the driving thin film transistor D-TFT due to a low leakage current. Therefore, even though a data voltage Vdata for displaying image is not applied for every frame, the sub pixel PX may display an image on a screen based on a data voltage Vdata for displaying an image input in a previous frame.

The fourth transistor T4 may be configured to switch the electrical connection between the third node N3 of the driving thin film transistor D-TFT and the initialization voltage Vini line. The fourth transistor T4 may be controlled by a third scan signal Scan3 [n]. When a turn-on level voltage of third scan signal Scan3 [n] is applied, the initialization voltage Vini is applied to the third node N3 of the driving thin film transistor D-TFT.

The sixth transistor T6 may be configured to switch the electrical connection between the third node N3 of the driving thin film transistor D-TFT and a first electrode of the light emitting diode ED. The sixth transistor T6 includes a fourth node N4 and the fourth node N4 of the sixth transistor T6 is electrically connected to the first electrode of the light emitting diode ED. The fourth node N4 of the sixth transistor T6 may be a source node or a drain node of the sixth transistor T6. The first electrode of the light emitting diode ED may be an anode electrode or a cathode electrode. Hereinafter, according to an example embodiment of the present disclosure, the first electrode of the light emitting diode ED is considered to be an anode electrode, for the purpose of illustration without limiting the scope of the present disclosure.

An operation timing of the sixth transistor T6 is controlled by the emission signal EM[n]. The emission signal EM[n] which controls an operation timing of the sixth transistor T6 may be equal to an emission signal EM[n] which controls an operation timing of the fifth transistor T5. A gate node of the sixth transistor T6 and a gate node of the fifth transistor T5 may be electrically connected to one emission signal EM[n] line.

The seventh transistor T7 may be configured to switch the electrical connection between the first electrode of the light emitting diode ED and a reset voltage VAR line. When the first electrode of the light emitting diode ED is an anode electrode, the reset voltage VAR may be an anode reset voltage VAR.

An operation timing of the seventh transistor T7 may be controlled by a third scan signal Scan3[n+1]. The third scan signal Scan3[n+1] which controls an operation timing of the seventh transistor T7 may be the same signal as the third scan signal Scan3[n] which controls the operation timing of the fourth transistor T4 of the other sub pixel PX.

For example, the third scan signal Scan3[n+1] may be applied to the seventh transistor T7 included in a sub pixel PX which is electrically connected to an n-th (n is an integer of 1 or larger) gate line. The third scan signal Scan3[n+1] which is applied to the sub pixel PX may be the same signal as the third scan signal Scan3 [n] which is applied to the fourth transistor T4 included in the sub pixel PX located at an n+1-th gate line.

The first electrode of the light emitting diode ED or the organic light emitting diode (OLED) is electrically connected to the fourth node N4 of the sixth transistor T6. The second electrode of the organic light emitting diode (OLED) is electrically connected to the low potential driving voltage VSSEL line. The first electrode of the organic light emitting diode (OLED) may be an anode electrode or a cathode electrode. The second electrode of the organic light emitting diode (OLED) may be a cathode electrode or an anode electrode.

The high potential driving voltage VDDEL line and the low potential driving voltage VSSEL line may be common voltage lines which are commonly connected to a plurality of sub pixels PX disposed in the display panel 120.

According to an example embodiment of the present disclosure, the third transistor T3 may be an N-type transistor and the remaining transistors may be P-type transistors. The driving thin film transistor D-TFT, the second transistor T2, the fourth transistor T4, the fifth transistor T5, the sixth transistor T6, and the seventh transistor T7 may be P-type transistors and one or more transistors of the above-described transistors may be formed as N-type transistors.

Figure 3:
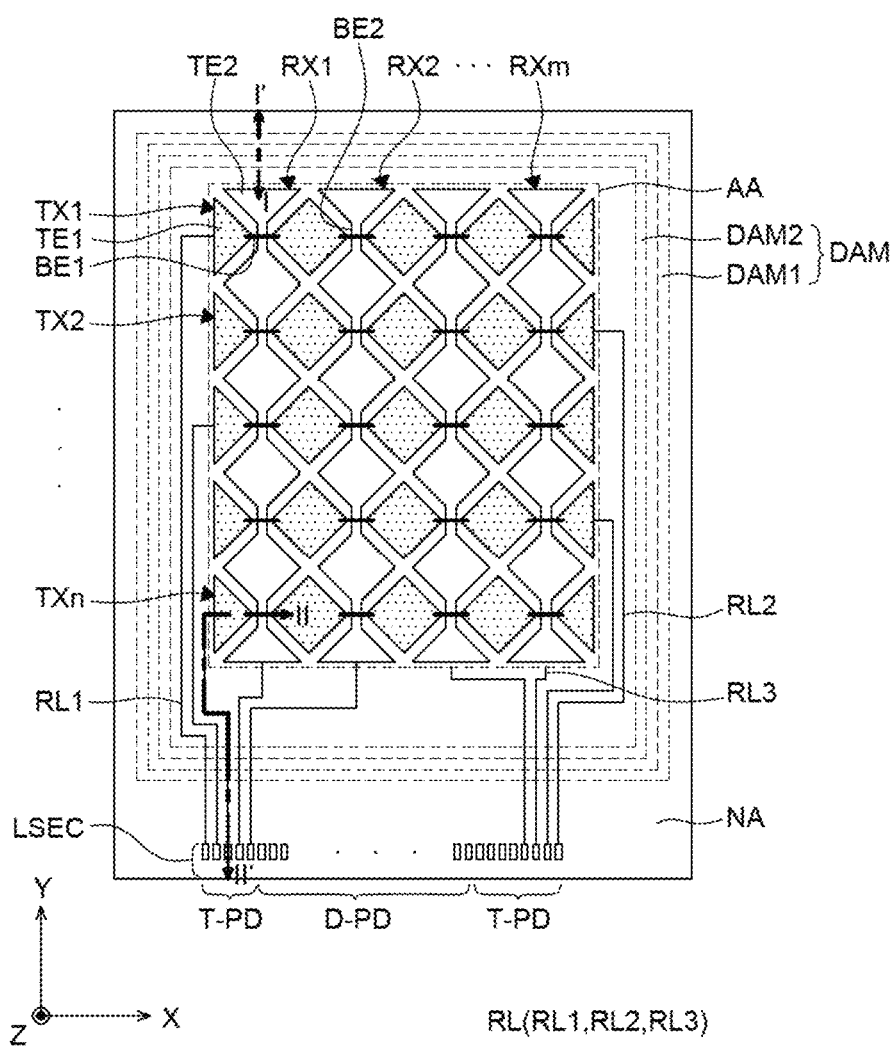
FIG. 3 is a plan view of a display apparatus according to an example embodiment of the present disclosure.

FIG. 3 is a plan view of a display apparatus according to an example embodiment of the present disclosure.

Referring to FIGS. 1 and 3 together, a touch unit (or a touch sensor unit) on the encapsulation unit 200 may use a capacitance method which supplies a signal in which a capacitance variance by the user's touch is reflected, to the touch driver. The touch unit may use a self-capacitance method or a mutual capacitance method. According to the self-capacitance method, each touch electrode independently supplies a signal in which a capacitance variance is reflected to the touch driver. According to the mutual capacitance method, each touch electrode supplies a signal in which the capacitance variance between first and second touch electrodes is reflected, to the touch driver. Hereinafter, according to an example embodiment of the present disclosure, a mutual-capacitance type touch unit is described as an example without limiting the scope of the present disclosure.

The touch unit may include a plurality of touch lines TX1 to TXn and RX1 to RXm which is disposed in the display area AA to provide capacitance type touch sensors. The plurality of touch lines TX1 to TXn and RX1 to RXm may be configured by a plurality of touch electrodes TE1 and TE2 and a plurality of touch connection electrodes BE1 and BE2. The touch unit may include a plurality of routing lines RL1, RL2, and RL3 and a plurality of touch pad electrodes T-PD disposed in the non-display area NA. When the touch unit is formed, an upper pad electrode, among the display pad electrodes D-PD, may be formed on the same layer as the upper pad electrode of the touch pad electrode T-PD with the same metal material and formed on the same layer as the touch electrodes TE1 and TE2 with the same metal material.

The touch unit includes a plurality of first touch lines TX1 to TXn and a plurality of second touch lines RX1 to RXm. The plurality of first touch lines TX1 to TXn includes (or is connected to) the plurality of first touch electrodes TE1 which is disposed in the first direction (or an X-axis direction or a horizontal direction) to be electrically connected. The plurality of second touch lines RX1 to RXm includes (or is connected to) the plurality of second touch electrodes TE2 disposed in a second direction (or a Y-axis direction or a vertical direction). The first and second electrodes TE1 and TE2 which are adjacent to each other may configure the mutual capacitance type touch sensors.

In each of the first touch lines TXi (where i=1 to n, where n is a natural number of 1 or greater), each first touch electrode TE1 disposed in the first direction X is connected to the adjacent first touch electrode TE1 through the first touch connection electrode BEl In each of the second touch lines RXj (where j=1 to m, where m is a natural number of 1 or greater), each second touch electrode TE2 disposed in the second direction Y is connected to the adjacent second touch electrode TE2 through the second touch connection electrode BE2. The first touch electrode TE1 may be referred to as a transmission electrode, and the second touch electrode TE2 may be referred to as a reception electrode, but the present disclosure is not limited thereto. The first touch lines TX1 to TXn may be referred to as transmission channels, and the second touch lines RX1 to RXm may be referred to as reception channels or read-out channels. Each of the first and second touch electrodes TE1 and TE2 are mainly formed to have a square shape or a rhombus shape, but is not limited thereto.

In the non-display area NA of the touch unit, a plurality of routing lines RL1, RL2, and RL3 connected to the plurality of touch lines TX1 to TXn and RX1 to RXm of the display area AA and a plurality of touch pad electrodes T-PD connected to the plurality of routing lines RL1, RL2, and RL3 may be disposed. The plurality of routing lines RL1, RL2, and RL3 may overlap the encapsulation unit 200 in the non-display area NA which encloses the display area AA. The touch driver is mounted on a circuit film and may be connected to the plurality of touch pad electrodes T-PD disposed in the non-display area NA through an anisotropic conductive film.

One ends of the plurality of first touch lines TX1 to TXn disposed in the display area AA may be connected to the touch driver through the plurality of first routing lines RL1 and the touch pad electrode T-PD disposed in the non-display area NA. The plurality of first routing lines RL1 may be individually connected to the touch pad electrodes T-PD disposed in a lower non-display area NA via any one of left and right non-display areas NA and the lower non-display area NA.

The touch driver drives the plurality of first touch lines TX1 to TXn and may be supplied with read-out signals output from the plurality of second touch lines RX1 to RXm and generate touch sensing data using the read-out signals. For example, the touch driver generates a touch sensing signal indicating whether a touch has occurred, by comparing read-out signals of two adjacent touch lines through a differential amplifier, converts the touch sensing signal to touch sensing data and output the touch sensing data to a touch controller. The touch controller detects a touch coordinate of the touch area (or the touch position) based on touch sensing data to provide the detected touch coordinates to a host system.

Figure 4:
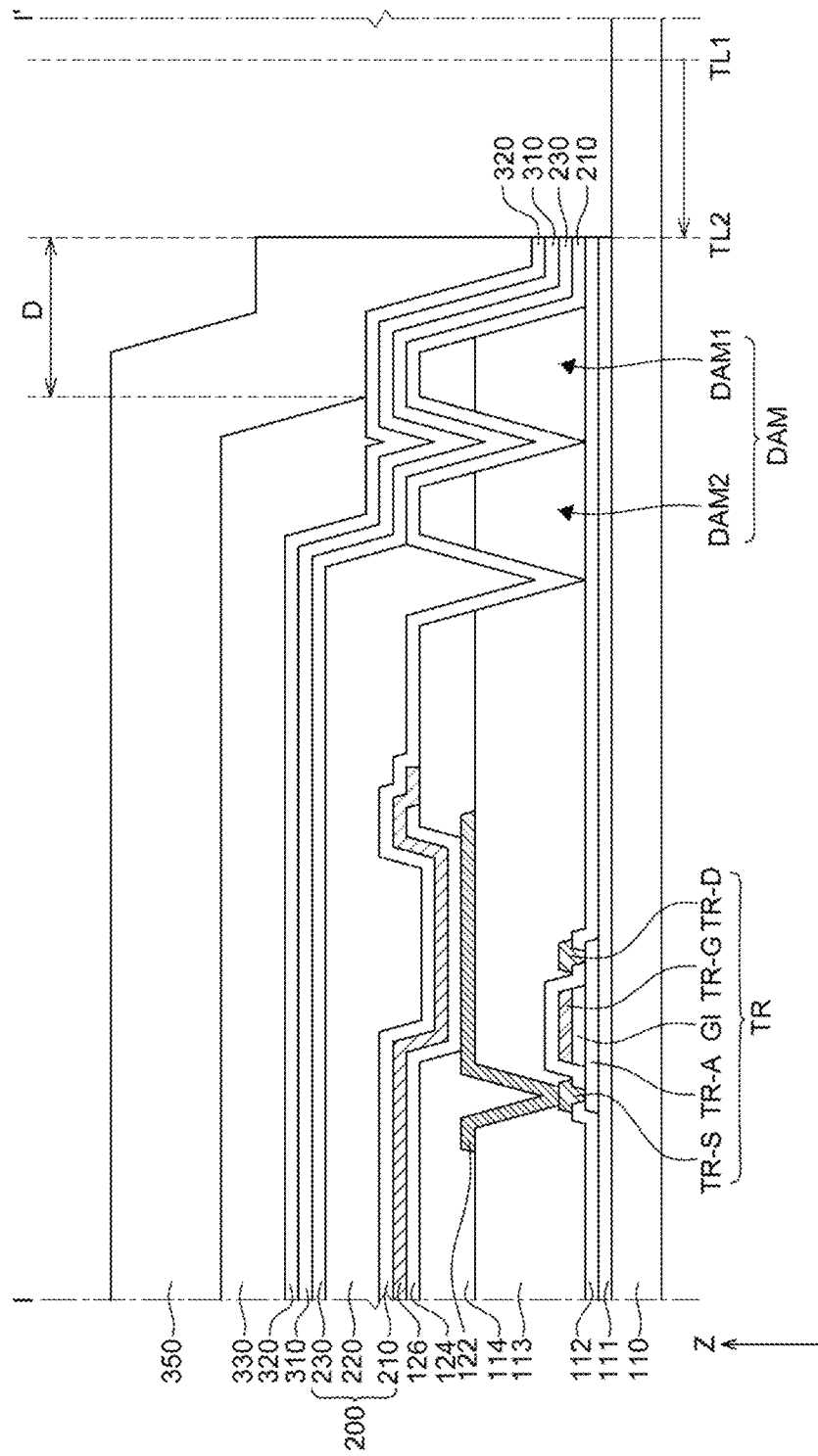
FIG. 4 is a cross-sectional view taken along a line I-I' of FIG. 3 according to an example embodiment of the present disclosure.
Figure 5:
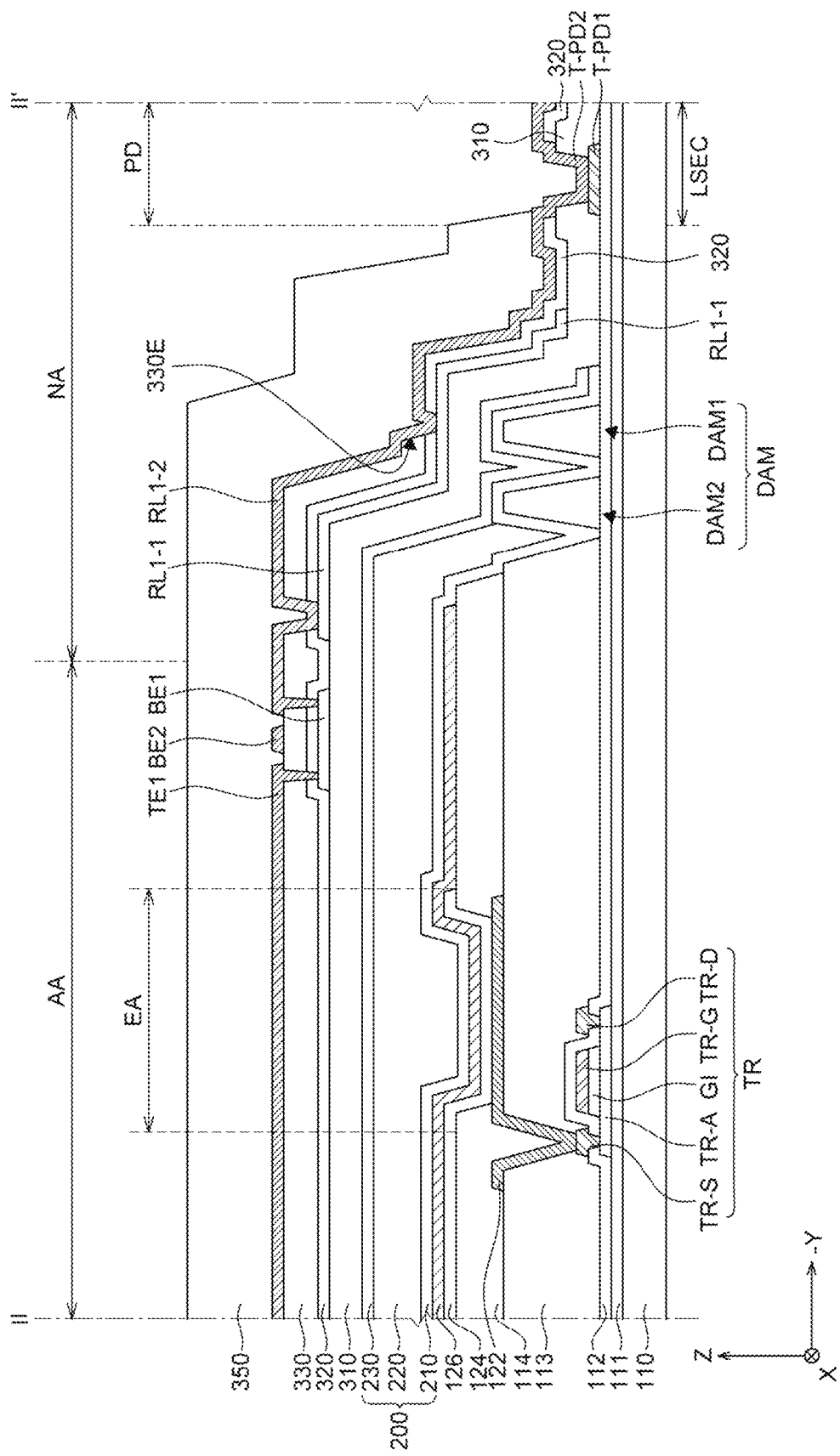
FIG. 5 is a cross-sectional view taken along a line II-IF of FIG. 3 according to an example embodiment of the present disclosure.

FIG. 4 is a cross-sectional view taken along the line I-I' of FIG. 3 according to an example embodiment of the present disclosure, and FIG. 5 is a cross-sectional view taken along the line II-IF of FIG. 3 according to an example embodiment of the present disclosure.

Referring of FIGS. 1, 3, 4, and 5 together, the display apparatus 100 (or the substrate 110) may include a display area AA and a non-display area NA located at the outside of the display area AA. For example, the non-display area NA may enclose the display area AA.

A lower buffer layer 111 may be disposed on the substrate 110. The lower buffer layer 111 may suppress the contamination of the substrate 110 in a subsequent process. The lower buffer layer 111 may extend onto the non-display area NA of the substrate 110. For example, the entire top surface of the substrate 110 may be covered by the lower buffer layer 111.

The lower buffer layer 111 may include an insulating material. For example, the lower buffer layer 111 may include an inorganic insulating material, such as silicon oxide (SiOx) or silicon nitride (SiNx). The lower buffer layer 111 may be of a structure having a plurality of layers. For example, the lower buffer layer 111 may have a lamination structure of an inorganic insulating film formed of silicon oxide (SiOx) and an inorganic insulting film formed of silicon nitride (SiNx).

In the display area AA of the substrate 110, a thin film transistor TR is disposed and a display element which is electrically connected to the thin film transistor TR may be disposed. In the example embodiment of the present disclosure, an organic light emitting diode is described as a display element, for the purpose of illustration without limiting the scope of the present disclosure.

The thin film transistor TR may include a semiconductor layer (or an active layer) TR-A including a channel through which electrons or holes move, a gate insulating layer GI, a gate electrode TR-G, a source electrode TR-S, and a drain electrode TR-D.

The semiconductor layer TR-A of the thin film transistor TR may be formed of a polycrystalline semiconductor material and/or an oxide semiconductor material, but is not limited thereto. A channel region is configured in the middle of the semiconductor layer TR-A and a source region and a drain region may be disposed with the channel region therebetween.

According to the example embodiment of the present disclosure, the thin film transistor TR may be a top gate structure in which the gate electrode TR-G is disposed above the semiconductor layer TR-A. The gate insulating layer GI may be disposed above the semiconductor layer TR-A.

The gate electrode TR-G may be disposed above the gate insulating layer GI which covers the channel region of the semiconductor layer TR-A. The gate electrode TR-G may be formed to correspond to the channel region in the middle of the semiconductor layer TR-A. The gate electrode TR-G may be configured by a metal material. For example, the gate electrode TR-G may be formed of a single layer, or a plurality of layers formed of any one of molybdenum (Mo), aluminum (Al), chrome (Cr), gold (Au), titanium (Ti), nickel (Ni), neodymium (Nd), and copper (Cu) or an alloy thereof, but is not limited thereto.

The gate insulating layer GI may be interposed between the semiconductor layer TR-A and the gate electrode TR-G. The gate insulating layer GI may be formed with the same shape as the gate electrode TR-G. The gate insulating layer GI may include an inorganic insulating material, such as silicon oxide (SiOx) and silicon nitride (SiNx).

The interlayer insulating layer 112 may be formed on the entire surface including an upper portion of the gate electrode TR-G. For example, the interlayer insulating layer 112 may be formed to cover a top surface and a side surface of the gate electrode TR-G, a side surface of the gate insulating layer GI, an exposed top surface and a side surface of the semiconductor layer TR-A, and the lower buffer layer 111. For example, the interlayer insulating layer 112 may be formed to cover the entire surface of the substrate 110.

The interlayer insulating layer 112 may include an inorganic insulating material such as silicon oxide (SiOx) and silicon nitride (SiNx) or may be configured by an organic insulating material such as benzocyclobutene or photo acryl. The interlayer insulating layer 112 may include first and second contact holes which expose both sides of the semiconductor layer TR-A. The first and second contact holes may be disposed on both sides of the gate electrode TR-G to be spaced apart from the gate electrode TR-G.

The source electrode TR-S and the drain electrode TR-D may be connected to the semiconductor layer TR-A through the first and second contact holes of the interlayer insulating layer 112. For example, the source electrode TR-S and the drain electrode TR-D are formed on the interlayer insulating layer 112 and may be connected to the source region and the drain region of the semiconductor layer TR-A through the first and second contact holes.

The thin film transistor TR is configured by the semiconductor layer TR-A, the gate electrode TR-G, the source electrode TR-S, and the drain electrode TR-D, and configures (or is implemented as) the driving circuit. The thin film transistor TR according to the example embodiment of the present disclosure may have a coplanar structure in which the gate electrode TR-G, the source electrode TR-S, and the drain electrode TR-D are disposed above the semiconductor layer TR-A.

A planarization layer 113 may be disposed above the thin film transistor TR. The planarization layer 113 serves to planarize a top surface of the driving circuit. For example, the planarization layer 113 may be formed to be higher than the driving circuit. For example, the planarization layer 113 may be configured to have a predetermined height from the substrate 110. The planarization layer 113 may be configured by at least one organic film or at least one inorganic film, but is not limited thereto. The planarization layer 113 may include a plurality of contact holes which exposes the source electrode TR-S or the drain electrode TR-D of the thin film transistor TR.

A light emitting diode may be disposed above the planarization layer 113. The light emitting diode according to the example embodiment of the present disclosure may be an organic light emitting diode. The light emitting diode above the planarization layer 113 may be configured by a first electrode 122, an emission unit 124, and a second electrode 126. The first electrode 122 may be an anode electrode or a pixel electrode, but is not limited thereto. The second electrode 126 may be a cathode electrode or a common electrode, but is not limited thereto.

An area in which the first electrode 122, the emission unit 124, and the second electrode 126 are bonded to be laminated may be an emission area EA. The emission area EA may be defined by the bank layer 114 above the planarization layer 113.

The first electrode 122 may be electrically connected to the source electrode TR-S or the drain electrode TR-D of the thin film transistor TR through a contact hole of the planarization layer 113. For example, a part of the first electrode 122 extends through the contact hole to be connected to the source electrode TR-S or the drain electrode TR-D of the thin film transistor TR.

When the display apparatus 100 according to an example embodiment of the present disclosure is a top emission type, light generated in the light emitting diode travels toward a top surface (Z-axis direction) of the substrate. When the display apparatus 100 according to an example embodiment of the present disclosure is a bottom emission type, light generated in the light emitting diode travels toward a rear surface (−Z-axis direction) of the substrate. However, the present disclosure is not limited to the foregoing. In the top emission type, in order to reflect the light generated in the emission unit 124 to the second electrode 126 direction, the first electrode 122 may further include a reflective layer. For example, the reflective layer may be configured by silver (Ag) or an aluminum-palladium-copper (APC) alloy. For example, the first electrode 122 may have a triple layered structure of ITO/Ag/ITO or ITO/APC/ITO. For a bottom emission type, the first electrode 122 may be configured by a single layer structure of a transparent conductive material layer.

The bank layer 114 covers the edge of the first electrode 122 disposed above the planarization layer 113 to define the emission area EA. For example, a top surface of the first electrode 122 which is not covered by the bank layer 114 may be an emission area EA. The bank layer 114 may include an organic insulating material and may include a material different from that of the planarization layer 113.

The emission unit 124 and the second electrode 126 may be disposed on a top surface of the first electrode 122. The emission unit 124 may generate a light having a luminance corresponding to a voltage difference between the first electrode 122 and the second electrode 126. For example, the emission unit 124 may include an emission material layer (EML). The emission material layer may include an organic material, an inorganic material, or a hybrid material. The display apparatus 100 according to the example embodiment of the present disclosure may be an organic light emitting display apparatus including an organic material.

The emission unit 124 may be of a structure having a plurality of layers. For example, the emission unit 124 may include a hole injection layer (HIL), a hole transport layer (HTL), an emission material layer, an electron transport layer (ETL), and an electron injection layer (EIL), but is not limited thereto. When a basic structure for emission is a stack configured by the hole transport layer, the emission material layer, and the electron transport layer, the emission unit 124 may be a tandem type of light emitting diode including a plurality of stacks.

The emission unit 124 may be disposed for (or in) every sub pixel PX to overlap the emission area EA or configured as a plate shape on the entire surface of the substrate 110, but is not limited thereto.

The second electrode 126 may be disposed above the emission unit 124. The second electrode 126 may be formed in a plate shape on the entire surface of the substrate 110. In the top emission type, the second electrode 126 may be configured as a transparent electrode. For example, the second electrode 126 may include indium tin oxide (ITO) or indium zinc oxide (IZO). In the bottom emission type, in order to reflect the light generated in the emission unit 124 to the first electrode 122 direction, the second electrode 126 may further include a reflective layer. For example, the second electrode 126 may include at least one of metals such as copper or a molybdenum-titanium (MoTi) alloy.

The encapsulation unit 200 may be disposed on the entire surface of the light emitting diode. The encapsulation unit 200 is disposed in a remaining part excluding the outermost edge of the substrate 110 to enclose all of the front surface and side surfaces of the light emitting diode. The encapsulation unit 200 is configured to block the permeation of the oxygen or moisture into the light emitting diode, specifically, into the emission unit 124 to improve the reliability of the light emitting diode. The encapsulation unit 200 may be configured by a plurality of layers of a first encapsulation layer 210, a second encapsulation layer 220, and a third encapsulation layer 230, but is not limited thereto.

The first encapsulation layer 210 may include an inorganic material. For example, the first encapsulation layer 210 may include a single layered structure of any one of a silicon oxide film (SiOx), a silicon nitride film (SiNx), a silicon oxynitride film (SiONx), a titanium oxide film (TiOx), and an aluminum oxide film (AlOx), or a laminated structure thereof.

The second encapsulation layer 220 may be configured to be relatively thicker than the first encapsulation layer 210 sufficient to cover foreign materials which may be generated on the first encapsulation layer 210. The second encapsulation layer 220 may be a particle cover layer (PCL) or an organic encapsulation layer, but is not limited thereto. The second encapsulation layer 220 may include an organic material or a liquid organic material. For example, the second encapsulation layer 220 may be configured by an organic material such as silicon oxy carbon (SiOCz), acryl, or epoxy based resin.

The third encapsulation layer 230 may be configured to cover all of the first encapsulation layer 210 and the second encapsulation layer 220. The third encapsulation layer 230 may include an inorganic material which is the same as or different from that of the first encapsulation layer 210.

A dam structure DAM may be configured to block or adjust the spreading in (or of) the second encapsulation layer 220 of the encapsulation unit into the substrate 110 or overflowing to the outside of the substrate 110 through an edge of the outermost sub pixel PX. The dam structure DAM separates or disconnects at least a part of the light emitting diode at an edge of the outermost sub pixel PX to block a lateral moisture permeation path to the sub pixel PX, to suppress or minimize the degradation of the reliability of the light emitting diode. The dam structure DAM may be configured in the non-display area NA, but is not limited thereto.

The dam structure (or a dam part) DAM may be configured by a plurality of dams, such as a first dam DAM1 and a second dam DAM2, but is not limited thereto. The plurality of dams is configured as the dam structure DAM to adjust a degree of spreading of the second encapsulation layer 220 in the substrate 110 or a degree of overflowing of the second encapsulation layer 220 to the outside of the substrate 110. The dam structure DAM may be configured by forming a trench in the planarization layer 113 and/or the bank layer 114 extending from the outermost sub pixel PX to the non-display area NA.

The encapsulation unit 200 may be configured to include the second encapsulation layer 220 between the first encapsulation layer 210 and the third encapsulation layer 230. For example, the first encapsulation layer 210 and the third encapsulation layer 230 may be in contact with each other, in an area other than an area in which the second encapsulation layer 220 on the substrate 110 is configured. For example, the area in which the second encapsulation layer 220 is configured may be formed to be a starting area of the dam structure DAM from the display area AA to the non-display area NA or to spread over the ending area of the dam structure DAM. For example, a location where the first encapsulation layer 210 is in contact with the third encapsulation layer 230 may be an edge of the second encapsulation layer 220. For example, a location where the first encapsulation layer 210 is in contact with the third encapsulation layer 230 may be a side and a top of the second dam DAM2 and a side and a top of the first dam DAM1.

The touch unit may be configured above the encapsulation unit 200. The touch unit according to the example embodiment of the present disclosure is disposed on the encapsulation unit with the buffer layer (e.g., layers 310, 320 and 330) having a similar high height as the encapsulation unit therebetween in the display area AA. Accordingly, the manufacturing process is simplified more than a touch panel attaching method to reduce the manufacturing cost and a parasitic capacitance between the touch unit and the display panel 120 is reduced to improve a touch sensing performance, thereby improving a product reliability.

The touch unit may include touch lines TXi and RXj (where i=1 to n, j=1 to m, n and m are natural numbers of 1 or greater) disposed between a first touch buffer layer 310, a second touch buffer layer 320, a touch insulating layer 330, and a touch protection layer 350, a routing line RL, and a touch pad electrode T-PD. The touch lines TXi and RXj may be configured by touch electrodes TE1 and TE2 and touch connection electrodes BE1 and BE2. The routing line RL may be configured by a first routing line RL1, a second routing line RL2, and a third routing line RL3, and each routing line (e.g., each of RL1, RL2, and RL3) may be divided into a lower routing line (e.g., RL1-1) and an upper routing line (e.g., RL1-2).

Each of the touch electrodes TE1 and TE2, each of the touch connection electrodes BE1 and BE2, and each routing line RL may include a conductive material having a resistance lower than a metal. For example, each of the touch electrodes TE1 and TE2, each of the touch connection electrodes BE1 and BE2, and each routing line RL may be configured by metal such as aluminum (Al), titanium (Ti), copper (Cu), molybdenum (Mo), and tantalum (Ta), or an alloy of one or more of these metals. Further, each of the touch electrodes TE1 and TE2, each of the touch connection electrodes BE1 and BE2, and each routing line RL may be of a structure having a single layer or a plurality of layers. For example, each of the touch electrodes TE1 and TE2, each of the touch connection electrodes BE1 and BE2, and each routing line RL may have a triple layered structure, such as Ti/Al/Ti, MoTi/Cu/MoTi, or Ti/Al/Mo, but the present disclosure is not limited thereto.

The first touch connection electrode BE1 and the lower routing line RL1-1 may be formed of the same material and by the same process (thus, for example, having the same height). The first touch electrode TE1, the second touch electrode TE2, the second touch connection electrode BE2, and the upper routing line RL1-2 may be formed of the same material and by the same process (thus, for example, having the same height).

The first touch buffer layer 310 may be disposed on the encapsulation unit. For example, the first touch buffer layer 310 may be disposed between the third encapsulation layer 230 and the second touch buffer layer 320. For example, the first touch buffer layer 310 may be disposed between the third encapsulation layer 230 and the first touch connection electrode BE1. For example, the first touch buffer layer 310 may be disposed between the third encapsulation layer 230 and the lower routing line RL1-1.

The first touch buffer layer 310 may reduce a parasitic capacitance generated between the second electrode 126 of the light emitting diode and the touch lines TXi and RXj. For example, a distance between the second electrode 126 and the touch electrodes TE1 and TE2 and a distance between the second electrode 126 and the touch connection electrodes BE1 and BE2 may be adjusted by a thickness of the first touch buffer layer 310. Further, the first touch buffer layer 310 may suppress the damage to the encapsulation unit 200 during the process of manufacturing the touch unit. The first touch buffer layer 310 may include an inorganic insulating material, such as silicon oxide (SiOx) or silicon nitride (SiNx).

The second touch buffer layer 320 and the touch insulating layer 330 may be sequentially disposed above the first touch buffer layer 310. The first touch connection electrode BE1 and the lower routing line RL1-1 may be disposed between the second touch buffer layer 320 and the first touch buffer layer 310. The first touch electrode TE1, the second touch electrode TE2, the second touch connection electrode BE2, and the upper routing line RL1-2 may be disposed above the touch insulating layer 330.

The first touch electrode TE1 extends through a plurality of common contact holes in the second touch buffer layer 320 and the touch insulating layer 330 of the display area AA so that the first touch electrode TE1 is electrically connected to the first touch connection electrode BE1. The upper routing line RL1-2 extends through a plurality of common contact holes in the second touch buffer layer 320 and the touch insulating layer 330 of the non-display area NA so that the upper routing line RL1-2 is electrically connected to the lower routing line RL1-1.

The second touch buffer layer 320 may include an inorganic insulating material, such as silicon oxide (SiOx) or silicon nitride (SiNx). The touch insulating layer 330 may be configured by an organic insulating material, such as benzocyclobutene or photo-acryl, but is not limited thereto.

If the touch insulating layer 330 is in direct contact with the first touch connection electrode BE1 in the display area AA, a lifting phenomenon of the touch insulating layer 330 may be caused during the subsequent process. For example, a partial area of the touch insulating layer 330 including the common contact hole may be in direct contact with the first touch connection electrode BE1. In this case, due to the thermal deformation and low adhesion characteristics of the organic material, a phenomenon in which the surrounding part of the common contact hole of the touch insulating layer 330 does not come into contact with the first touch connection electrode BE1, but is lifted in a subsequent process. In order to suppress this problem, the second touch buffer layer 320 configured by the inorganic material is disposed between the first touch connection electrode BE1 and the touch insulating layer 330. By doing so, it is possible to reduce the lifting and a contact failure due to the low adhesive characteristic of the organic material and the thermal deformation difference between the metal and the organic material. For example, in an area other than an area of the top surface of the first touch connection electrode BE1 which is in contact with the first touch electrode TE1 through the common contact hole, the first touch connection electrode BE1, the second touch buffer layer 320, and the touch insulating layer 330 may be laminated in this order.

If the touch insulating layer 330 is in direct contact with the lower routing line RL-1 in the non-display area NA, a lifting phenomenon of the touch insulating layer 330 may be caused during the subsequent process. For example, a partial area of the touch insulating layer 330 including the common contact hole may be in direct contact with the lower routing line RL1-1. In this case, due to the thermal deformation and low adhesion characteristics of the organic material, a phenomenon in which the surrounding part of the common contact hole of the touch insulating layer 330 does not come into contact with the lower routing line RL1-1, but is lifted in a subsequent process. In order to suppress this problem, the second touch buffer layer 320 configured by the inorganic material is disposed between the lower routing line RL1-1 and the touch insulating layer 330. By doing so, it is possible to reduce the lifting and a contact failure due to the low adhesive characteristic of the organic material and the thermal deformation difference between the metal and the organic material. For example, in an area other than an area of the top surface of the lower routing line RL1-1 which is in contact with the upper routing line RL1-2 through the common contact hole, the lower routing line RL1-1, the second touch buffer layer 320, and the touch insulating layer 330 may be laminated in this order.

The pad area PD may be disposed at one side of the non-display area NA of the display panel 120. In the pad area PD, the plurality of display pad electrodes D-PD and the plurality of touch pad electrodes T-PD may be configured. For example, the plurality of display pad electrodes D-PD and the plurality of touch pad electrodes T-PD may be disposed in parallel to each other. The display pad electrodes D-PD and the touch pad electrodes T-PD may have the same structure.

The touch protection layer 350 may be disposed at an uppermost end of the touch unit. The touch protection layer 350 may be configured by an organic material. The touch protection layer 350 may suppress the damages to the touch unit and a lower portion thereof due to the external impact and moisture. The touch protection layer 350 may be formed on the entire surface of the display panel 120 excluding the pad area PD. For example, the touch protection layer 350 may expose the display pad electrode D-PD and the touch pad electrode T-PD of the pad area PD.

The touch insulating layer 330 may be formed on the entire surface of the display panel 120, excluding a portion(s) of the non-display area NA (e.g., excluding the pad area PD). For example, the touch insulating layer 330 (or an edge thereof) may extend to, or may end at, a location marked as 330E in the non-display area as shown in FIG. 5, and the touch insulating layer 330 does not extend to an area where the lower touch pad electrode T-PD1 and the upper touch pad electrode T-PD2 are connected, in a lower surface direction (−Y direction) of the substrate 110.

The touch pad electrode T-PD may be configured by a lower touch pad electrode T-PD1 and an upper touch pad electrode T-PD2. The touch pad electrode T-PD may be formed together using the process of forming the driving circuit, the light emitting diode, and the touch unit. For example, the lower touch pad electrode T-PD1 may include the same material as the source electrode TR-S and the drain electrode TR-D of the driving circuit. For example, the upper touch pad electrode T-PD2 may include the same material as the first touch electrode TE1, the second touch electrode TE2, and the second touch connection electrode BE2 of the touch unit.

The lower touch pad electrode T-PD1 may be disposed in the form of an island shape having a rectangular shape or parallelogram shape in the pad area PD. The upper touch pad electrode T-PD2 may be disposed crossing the pad area PD to the non-display area NA direction (−Y direction) from the display area AA. The lower touch pad electrode T-PD1 and the upper touch pad electrode T-PD2 may be connected to each other in the pad area PD. For example, a top surface of the lower touch pad electrode T-PD1 may be electrically connected to the upper touch pad electrode T-PD2.

Referring to, for example, FIGS. 3 and 5, the substrate 110, the lower buffer layer 111, the interlayer insulating layer 112, the first touch buffer layer 310, the second touch buffer layer 320, and the upper touch pad electrode T-PD2 may be exposed at a longitudinal edge section LSEC of the substrate 110 in the downward direction (−Y direction). For example, the touch insulating layer 330 may not be exposed in the longitudinal edge section LSEC of the substrate 110. In order to form a step to be low in the longitudinal edge section LSEC of the downward direction (−Y direction) of the substrate 110, the lower portion of the upper touch pad electrode T-PD2 may be configured by the first touch buffer layer 310 and the second touch buffer layer 320 each of which is an inorganic film. A size of the non-display area NA is reduced and the bezel area is minimized by the low step of the longitudinal edge section LSEC of the substrate 110. In the pad area PD, a top surface of the upper touch pad electrode T-PD2 may be exposed.

The touch lines TXi and RXj (where i=1 to n, j=1 to m, and n and m are natural numbers of 1 or greater) may be electrically connected to the touch pad T-PD through the routing line RL. For example, the routing line RL may electrically connect each of the touch lines TXi and RXj and a part of the touch pad T-PD. In one example, the routing line RL may connect one or each of the touch lines TXi and RXj to the touch pad T-PD on the left and right (or up and down) sides of the touch lines TXi and RXj. In another example, the routing line RL may connect one or each of the touch lines TXi and RXj to the touch pad T-PD only at one side of the left and right (or up and down) sides of the touch lines TXi and RXj. The routing line RL according to the example embodiment of the present disclosure may connect each of the touch lines TXi and RXj to the touch pad T-PD only at one side of the left and right (or up and down) sides of the touch lines TXi and RXj. By doing so, a total number of routing lines RL which extend to the non-display area NA may be reduced and the bezel area may be minimized.

The routing line RL connected to the first touch lines TXi may include a first routing line RL1, a second routing line RL2, and a third routing line RL3. For example, the first routing line RL1 electrically connects a part of the first touch lines TXi and a part (or a first part) of the touch pad T-PD, the second routing line RL2 electrically connects the remaining part of the first touch lines TXi and a part (or a second part) of the touch pad T-PD, and the third routing line RL3 electrically connects the second touch lines RXj and a part (a third part) of the touch pad T-PD.

Each routing line RL in the non-display area NA may extend along an edge of the display area AA. For example, the first routing line RL1 may connect an odd-numbered first touch line TXi and a part of the touch pad T-PD at the left side of the display area AA, and the second routing line RL2 may connect an even-numbered first touch line TXi and another part of the touch pad T-PD at the right side of the display area AA. As another example, the first routing line RL1 may connect odd-numbered first touch lines TXi and a part(s) of the touch pad T-PD at the left side of the display area AA, and the second routing line RL2 may connect even-numbered first touch lines TXi and another part(s) of the touch pad T-PD at the right side of the display area AA. As yet another example, the first routing line RL1 may connect the first touch electrode(s) TE1 of an odd-numbered first touch line(s) TXi and a part(s) of the touch pad T-PD at the left side of the display area AA, and the second routing line RL2 may connect the first touch electrode(s) TE1 of an even-numbered first touch line(s) TXi and another part(s) of the touch pad T-PD at the right side of the display area AA. For example, the first routing line RL1 may connect an odd-numbered electrode(s) of the plurality of first touch electrodes TE1 to at least first one of at least one of the plurality of touch pads T-PD at the left side of the display area AA, and the second routing line RL2 may connect an even-numbered electrode(s) of the plurality of first touch electrodes TE1 to at least second one of the at least one of the plurality of touch pads T-PD at the right side of the display area AA. The plurality of touch pads T-PD may represent the plurality of touch pad electrodes T-PD. By doing the foregoing, the number of routing lines RL disposed in the non-display area NA at the left and right sides of the first touch lines TXi may be reduced, and an area occupied by the extending routing line RL is reduced to minimize left and right bezel areas of the display apparatus 100.

The third routing line RL3 may connect the second touch lines RXj and a part(s) of the touch pad T-PD at a lower side of the display area AA. For example, the third routing line RL3 is connected to the lower side of the second touch lines RXj without the need to detour around the left side or the right side of the non-display area NA so that the third routing line RL3 may connect the lower side of the second touch lines RXj and a part(s) of the touch pad T-PD. In an example, the third routing line RL3 may connect the second touch electrodes RXj to at least third one of the at least one of the plurality of touch pads T-PD. By doing so, a length of the third routing line RL3 may be minimized and upper and lower bezel areas of the display apparatus 100 may be minimized.

Each routing line RL may be configured by an upper routing line RL1-2 and a lower routing line RL1-1. The lower routing line RL1-1 may be formed by the same process as the first touch connection electrode BE1, and the upper routing line RL1-2 may be formed by the same process as the first touch electrode TE1, the second touch electrode TE2 and/or the second touch connection electrode BE2. The upper routing line RL1-2 and the lower routing line RL1-1 may be electrically connected through a plurality of common contact holes. By doing so, even though a partial area (or a certain portion) of the routing line RL is disconnected, the disconnection of the entire routing line is suppressed (or can be prevented), enhancing the reliability of the display apparatus 100.

In order to achieve the interlayer insulation, in the display apparatus 100 according to the example embodiment of the present disclosure, the touch insulating layer 330 may be formed using the organic material while the first touch buffer layer 310 and the second touch buffer layer 320 are formed of inorganic materials. As an example, each of the first touch buffer layer 310 and the second touch buffer layer 320, which is formed of an inorganic interlayer insulating layer, may generally have a thickness of approximately 1500 Å. As a further example, the touch insulating layer 330, which is formed of an organic material, may have a thickness of approximately 6000 Å.

In the non-display area NA, an end portion of the encapsulation unit 200 may have one or more steps. For example, the end portions of the second encapsulation layer 220 and the third encapsulation layer 230 having a large thickness have a stepwise step profile. A plurality of routing lines RL is disposed along the stepwise end portions of the second encapsulation layer 220 and the third encapsulation layer 230. For example, the routing line RL may include a lower routing line RL1-1 disposed along the end portion of the encapsulation unit and an upper routing line RL1-2. The upper routing line RL1-2 is disposed along an end portion of the touch insulating layer 330 and is connected to the lower routing line RL1-1 through the common contact hole on the end portions of the touch insulating layer 330 and the second touch buffer layer 320. Therefore, the plurality of routing lines RL is stably configured in the stepwise end portions of the touch insulating layer 330 and the encapsulation unit 200 without having a disconnection defect to improve a product yield and a product reliability.

The upper routing line RL1-2 and the lower routing line RL1-1 may have an electrical resistance component. For example, the electrical resistance of the lower routing line RL1-1 formed in (or under or below) the touch insulating layer 330 is proportional to a unique specific resistance of the line and a length of the line, and is inversely proportional to a cross-sectional area (a product of a width of line and a height of the line) of the line. The lower routing line RL1-1 is formed in (or under or below) the touch insulating layer 330 so that the height of the lower routing line RL1-1 may be restricted by the height of the touch insulating layer 330. For example, when the height of the touch insulating layer 330 is increased, the height of the lower routing line RL1-1 may be increased.

The display apparatus 100 according to the example embodiment of the present disclosure may have a modified cross-sectional shape of the wiring line while maintaining the same resistance of the lower routing line RL1-1. For example, the electrical resistance may be maintained constant by reducing the width of the lower routing line RL1-1 and increasing the height thereof. For example, the thickness of the touch insulating layer 330 which is formed of an organic material is four times greater than the thickness of an interlayer insulating layer which is formed of an inorganic material. Accordingly, when a height of the lower routing line RL1-1 is configured to be approximately four times larger and the width is configured to be approximately four times smaller, the electrical resistance of the lower routing line RL1-1 may be maintained constant (e.g., at the same resistance value). In this example, a height (or a sectional height or a cross-sectional height) of the lower routing line RL1-1 is greater than a width (or a sectional width or a cross-sectional width) of the lower routing line RL1-1. When the width of the lower routing line RL1-1 is reduced, the area in which the line extends to the non-display area NA to be disposed may be reduced so that the bezel area may be minimized.

Just as the modification of the cross-sectional shape of the lower routing line RL1-1 depends on the height of the touch insulating layer 330, the upper routing line RL1-2 depends on the height of the touch protection layer 350 so that the bezel area of the display apparatus 100 may be minimized. Further, the first touch connection electrode BE1 in the display area AA is configured according to the above-mentioned principle to improve an aperture ratio of the display area AA.

In the meantime, after sequentially configuring a driving circuit, the display element, the encapsulation unit 200, and the touch unit for a plurality of display panels 120 on the mother substrate 110, the mother substrate 110 is cut along a predetermined scribing line to divide the display panel 120 into a plurality of display panels 120. Therefore, a process of trimming an outer edge portion of each substrate 110 or each display panel by trimming may be performed. The trimming process may be performed using laser or dry etching, but is not limited thereto.

In the trimming process which is performed to a predetermined trimming line at an upper end of the display panel 120, the first cutting surface TL1 may be exposed. For example, the first cutting surface TL1 may be a trimming line. For example, in order to reduce the bezel area, the first cutting surface TL1 may be placed at a location immediately before exposing the first touch buffer layer 310. For example, the first cutting surface TL1 may expose cross-sectional surfaces of the substrate 110, the lower buffer layer 111, the interlayer insulating layer 112, the first encapsulation layer 210, the third encapsulation layer 230, the first touch buffer layer 310, and the second touch buffer layer 320. By doing so, the size of the bezel area may be minimized.

In order to further reduce the bezel area, the trimming line is placed at a location immediately before exposing the dam structure DAM to expose the second cutting surface TL2. For example, the second cutting surface TL2 may be a trimming line. The second cutting surface TL2 may expose each of the cross-sectional surfaces of the substrate 110, the lower buffer layer 111, the interlayer insulating layer 112, the first encapsulation layer 210, the third encapsulation layer 230, the first touch buffer layer 310, and the second touch buffer layer 320. For example, the second cutting surface TL2 may expose a cross sectional surface of the touch protection layer 350. The bezel area may be further reduced by moving the trimming line toward the display area AA.

Prior to the trimming process of the second cutting surface TL2, the routing line RL is vertically formed by the touch insulating layer 330 having a large (or significant) height to increase the exposure so that metal residuals of the routing line RL may be generated during and/or after the trimming process. In order to reduce the metal residuals, when the trimming line is the second cutting line TL2, the outer edge portions (or ends) of the touch insulating layer 330 may have a predetermined distance D from the second cutting surface TL2. For example, an end of the touch insulating layer 330 may be placed at a distance D of 10 μm or more from the second cutting surface TL2 toward the display area AA. By doing so, the metal residuals of the routing line RL which is generated during and/or after the trimming process of the second cutting surface TL2 may be reduced.

According to the example embodiment of the present disclosure, a width of an area in which a touch routing line is disposed is reduced and a display panel is cut to be closer to the display area to minimize the bezel area.

In one or more aspects, a pad unit may refer to a pad area. A pad area may include one or more pad areas. In one or more aspects, a pixel may refer to a sub pixel, and a plurality of pixels may refer to a plurality of sub pixels. In one or more aspects, an emission unit may refer to an emission element, an emission layer, or an emission structure. In one or more aspects, an encapsulation unit may refer to an encapsulation element, an encapsulation layer, an encapsulation structure, or an encapsulation formation. In one or more aspects, an encapsulation structure may include one or more layers or one or more encapsulation layers. In one or more aspects, a touch unit may refer to a touch structure, a touch arrangement, a touch sensor, or a touch formation. In one or more aspects, a touch structure may include one or more dielectric layers and one or more conductive electrodes. In one or more aspects, a touch pad may refer to a touch pad electrode. In one or more examples, a touch pad may be one or more touch pads. In one or more examples, a touch pad may include a plurality of touch pads or a plurality of touch pad electrodes. In one or more examples, a touch pad electrode may include a plurality of touch pad electrodes. In one or more aspects, a touch routing line may refer to a routing line. In one or more examples, a routing line may include a plurality of routing lines. In one or more examples, a part may include one or more parts. In one or more examples, a part of a touch pad may include one or more parts of a touch pad. In one or more examples, a part of a touch pad may include one or more touch pad electrodes. In one or more examples, a part of a touch pad may include at least one of a plurality of touch pads.

Various example embodiments and aspects of the present disclosure are described below. These are provided as examples, and do not limit the scope of the present disclosure.

According to one or more aspects of the present disclosure, there is provided a display apparatus. The display apparatus may include: a display area and a non-display area, wherein the non-display area includes a pad area; a plurality of pixels including a light emitting diode and a transistor in the display area, wherein the light emitting diode includes a first electrode, an emission element, and a second electrode, and wherein the transistor includes a gate electrode, a source electrode, and a drain electrode; an encapsulation structure which is disposed in the display area and a part of the non-display area; a touch structure, wherein at least a portion of the touch structure is disposed on the encapsulation structure, wherein the touch structure includes a plurality of touch dielectric layers and a plurality of touch conductive electrodes, wherein the plurality of touch dielectric layers includes a first touch dielectric layer and a second touch dielectric layer, and wherein the plurality of touch conductive electrodes includes a first touch conductive electrode and a second touch conductive electrode; a routing line formed of a same layer and of a same material as the second touch conductive electrode and connected to the second touch conductive electrode; and a touch pad disposed in the pad area and having a first touch pad and a second touch pad. The first and second touch dielectric layers may be disposed on the encapsulation structure. The second touch conductive electrode may be disposed on the first touch conductive electrode. The first touch pad may be formed of a same layer and of a same material as the source electrode of the transistor or the drain electrode of the transistor. The routing line may be extended and connected to the second touch pad. The second touch pad may be formed of a same layer and of a same material as the routing line and the second touch conductive electrode. At least one of the first and second touch dielectric layers may be extended to the pad area and may be disposed under the second touch pad. The second touch pad may be disposed on the first touch pad. The second touch pad may be connected to the first touch pad using at least an opening in the at least one of the first and second touch dielectric layers. The non-display area may include a cutting surface. Compared to the cutting surface, the touch pad may be disposed closer to the display area.

In an example, the first touch dielectric layer may be a first touch buffer layer, and a second touch dielectric layer may be a second touch buffer layer. In an example, a first touch conductive electrode may be a first touch connection electrode, and a second touch conductive electrode may be a second touch connection electrode. However, these are merely examples, and the scope of the present disclosure is not limited thereto.

The first touch conductive electrode may be disposed on the first touch dielectric layer, the second touch dielectric layer may be disposed on the first touch conductive electrode, and the second touch conductive electrode may be disposed on the second touch dielectric layer.

The plurality of touch dielectric layers may include a third touch dielectric layer disposed on the second touch conductive electrode.

In an example, the first touch dielectric layer may be a touch protection layer. However, this is merely an example, and the scope of the present disclosure is not limited thereto.

Each of the first and second touch dielectric layers may include an inorganic material, and the third touch dielectric layer may include an organic material.

The third touch dielectric layer may be thicker than each of the first and second touch dielectric layers.

The display apparatus may further include another routing line. The routing line may be disposed on the another routing line, and in the non-display area, the routing line may be connected to the another routing line.

In an example, the routing line may be an upper routing line, and the another routing line may be a lower routing line. However, these are examples, and the scope of the present disclosure is not limited thereto.

The touch structure may be configured by a first touch buffer layer, a plurality of touch connection electrodes, a second touch buffer layer, a touch insulating layer, a plurality of touch lines, and a touch protection layer. The display apparatus may further include: a substrate; and a plurality of routing lines which electrically connects the plurality of touch lines to at least one of a plurality of touch pads disposed in the pad area. At least a portion of the encapsulation structure may be exposed at the cutting surface. An end of the touch insulating layer may be spaced apart from the cutting surface toward the display area. The plurality of touch conductive electrodes may include the plurality of touch connection electrodes and the plurality of touch lines. The plurality of touch dielectric layers may include the first touch buffer layer, the second touch buffer layer, the touch insulating layer, and touch protection layer. The plurality of routing lines may include the routing line, and the plurality of touch pads may include the touch pad.

According to one or more aspects of the present disclosure, there is provided a display apparatus. The display apparatus may include: a substrate; a display area and a non-display area, where the non-display area includes a dam structure and a pad area; a plurality of pixels including a light emitting diode formed by a first electrode, an emission unit, and a second electrode, where the first electrode, the emission unit, and the second electrode are disposed in the display area; an encapsulation structure which is disposed in the display area and a part of the non-display area; a touch structure which is disposed on the encapsulation structure and is configured by a first touch buffer layer, a plurality of touch connection electrodes, a second touch buffer layer, a touch insulating layer, a plurality of touch lines, and a touch protection layer; and a plurality of routing lines which electrically connects the plurality of touch lines to at least one of a plurality of touch pads disposed in the pad area, where the pad area is disposed in the non-display area. The display apparatus may be configured so that the non-display area includes a cutting surface, the encapsulation structure is exposed at the cutting surface, and an end of the touch insulating layer is spaced apart from the cutting surface toward the display area.

The plurality of touch lines may include a plurality of first touch electrodes which is on the touch insulating layer and is disposed in a first direction; and a plurality of second touch electrodes which is disposed in a second direction perpendicular to the first direction. The plurality of touch connection electrodes may include a plurality of first touch connection electrodes which is disposed on the first touch buffer layer and connects the plurality of first touch electrodes; and a plurality of second touch connection electrodes which is on the touch insulating layer and connects the plurality of second touch electrodes.

The plurality of routing lines may include a first routing line which connects an odd-numbered electrode of the plurality of first touch electrodes to at least first one of the at least one of the plurality of touch pads; a second routing line which connects an even-numbered electrode of the plurality of first touch electrodes to at least second one of the at least one of the plurality of touch pads; and a third routing line which connects the plurality of second touch electrodes to at least third one of the at least one of the plurality of touch pads. Each of the first, second, and third routing lines may be configured by a lower routing line and an upper routing line, and the lower routing line and the upper routing line may be electrically connected.

The first routing line may be disposed in one side of the non-display area, and the second routing line may be disposed in another side of the non-display area, where the another side is different from the one side.

The upper routing line may be configured by a process (i) that is the same as a process configured at least one of the plurality of first touch electrodes or (ii) that is the same as a process configured at least one of the plurality of second touch electrodes.

The lower routing line may be configured by a process that is the same as a process configured at least one of the plurality of first touch connection electrodes.

A height of the lower routing line may be equal to a height of the at least one of the plurality of first touch connection electrodes.

A sectional height of the lower routing line may be greater than a sectional width of the lower routing line.

A height of the lower routing line may be different from a height of at least one of the plurality of first touch electrodes, a height of at least one of the plurality of second touch electrodes, or a height of at least one of the plurality of second touch connection electrodes.

The encapsulation structure may include a first encapsulation layer, a second encapsulation layer, and a third encapsulation layer. Further, a cross section of each of the substrate, the first encapsulation layer, and the third encapsulation layer may be exposed at the cutting surface.

A part of the dam structure may be exposed at the cutting surface.

A cross section of each of the first touch buffer layer and the second touch buffer layer or the touch protection layer may be exposed at the cutting surface.

An end of the touch insulating layer may be spaced apart from the cutting surface by 10 μm or more toward the display area.

According to one or more aspects of the present disclosure, there is provided a display apparatus. The display apparatus may include: a display area and a non-display area, wherein the non-display area includes a pad area; a plurality of pixels including a light emitting diode and a transistor in the display area, wherein the light emitting diode includes a first electrode, an emission element, and a second electrode, and wherein the transistor includes a gate electrode, a source electrode, and a drain electrode; an encapsulation structure which is disposed in the display area and a part of the non-display area; a touch structure, wherein at least a portion of the touch structure is disposed on the encapsulation structure, wherein the touch structure includes a plurality of touch dielectric layers and a first touch conductive electrode, and wherein the plurality of touch dielectric layers includes a first touch dielectric layer and a second touch dielectric layer; a routing line disposed in the non-display area; and a touch pad disposed in the pad area and having a first touch pad and a second touch pad. The first and second touch dielectric layers may be disposed on the encapsulation structure. The first touch pad may be formed of a same layer and of a same material as the source electrode of the transistor or the drain electrode of the transistor. The routing line may be extended and connected to the second touch pad. The second touch pad may be formed of a same layer and of a same material as the routing line. At least one of the first and second touch dielectric layers may be extended to the pad area and may be disposed under the second touch pad. The second touch pad may be disposed on the first touch pad. The second touch pad may be connected to the first touch pad using at least an opening in the at least one of the first and second touch dielectric layers. The non-display area may include a cutting surface.

Compared to the cutting surface, the touch pad may be disposed closer to the display area.

It will be apparent to those skilled in the art that various modifications and variations can be made in the present disclosure without departing from the technical idea or scope of the present disclosure. Thus, it is intended that the present disclosure covers the modifications and variations of this disclosure that come within the scope of the claims and their equivalents.

What is claimed is:

1. A display apparatus, comprising:
a display area and a non-display area, wherein the non-display area includes a pad area;
a plurality of pixels including a light emitting diode and a transistor in the display area, wherein the light emitting diode comprises a first electrode, an emission element, and a second electrode, and wherein the transistor comprises a gate electrode, a source electrode, and a drain electrode;
an encapsulation structure which is disposed in the display area and a part of the non-display area;
a touch structure, wherein at least a portion of the touch structure is disposed on the encapsulation structure, wherein the touch structure comprises a plurality of touch dielectric layers and a plurality of touch conductive electrodes, wherein the plurality of touch dielectric layers comprises a first touch dielectric layer, a second touch dielectric layer and a third touch dielectric layer, and wherein the plurality of touch conductive electrodes comprises a first touch conductive electrode and a second touch conductive electrode;
a routing line formed of a same layer and of a same material as the second touch conductive electrode and connected to the second touch conductive electrode;
another routing line disposed in the non-display area; and
a touch pad disposed in the pad area and comprising a first touch pad and a second touch pad,
wherein:
the first and second touch dielectric layers are disposed on the encapsulation structure;
the second touch conductive electrode is disposed on the first touch conductive electrode;
the first touch pad is formed of a same layer and of a same material as the source electrode of the transistor or the drain electrode of the transistor;
the routing line is extended and connected to the second touch pad;
the second touch pad is formed of a same layer and of a same material as the routing line and the second touch conductive electrode;
at least one of the first and second touch dielectric layers is extended to the pad area and is disposed under the second touch pad;
the second touch pad is disposed on the first touch pad;
the second touch pad is connected to the first touch pad using at least an opening in the at least one of the first and second touch dielectric layers;
the non-display area includes a cutting surface; and
in a portion of the non-display area, the routing line is disposed on the another routing line, and the second and third touch dielectric layers are disposed between the routing line and the another routing line.

2. The display apparatus according to claim 1, wherein:
the first touch conductive electrode is disposed on the first touch dielectric layer;
the second touch dielectric layer is disposed on the first touch conductive electrode; and
the second touch conductive electrode is disposed on the second touch dielectric layer.

3. The display apparatus according to claim 1, wherein the plurality of touch dielectric layers further comprises a fourth touch dielectric layer disposed on the second touch conductive electrode.

4. The display apparatus according to claim 3, wherein:
each of the first and second touch dielectric layers comprises an inorganic material; and
the third and fourth touch dielectric layers comprise an organic material.

5. The display apparatus according to claim 3, wherein the fourth touch dielectric layer is thicker than each of the first and second touch dielectric layers.

6. The display apparatus according to claim 1, wherein in the non-display area, the routing line is connected to the another routing line.

7. The display apparatus according to claim 1, wherein:
the touch structure is configured by a first touch buffer layer, a plurality of touch connection electrodes, a second touch buffer layer, a touch insulating layer, a plurality of touch lines, and a touch protection layer;
the display apparatus further comprises:
a substrate; and
a plurality of routing lines which electrically connects the plurality of touch lines to at least one of a plurality of touch pads disposed in the pad area;
at least a portion of the encapsulation structure is exposed at the cutting surface;
an end of the touch insulating layer is spaced apart from the cutting surface toward the display area;
the plurality of touch conductive electrodes comprises the plurality of touch connection electrodes and the plurality of touch lines;
the plurality of touch dielectric layers comprises the first touch buffer layer, the second touch buffer layer, the touch insulating layer, and touch protection layer;
the plurality of routing lines comprises the routing line; and
the plurality of touch pads comprises the touch pad.

8. The display apparatus according to claim 7, wherein the plurality of touch lines includes:
a plurality of first touch electrodes which is on the touch insulating layer and is disposed in a first direction; and
a plurality of second touch electrodes which is disposed in a second direction perpendicular to the first direction, and
wherein the plurality of touch connection electrodes includes:
a plurality of first touch connection electrodes which is disposed on the first touch buffer layer and connects the plurality of first touch electrodes; and
a plurality of second touch connection electrodes which is on the touch insulating layer and connects the plurality of second touch electrodes.

9. The display apparatus according to claim 8, wherein the plurality of routing lines includes:
a first routing line which connects an odd-numbered electrode of the plurality of first touch electrodes to at least first one of the at least one of the plurality of touch pads;
a second routing line which connects an even-numbered electrode of the plurality of first touch electrodes to at least second one of the at least one of the plurality of a third routing line which connects the plurality of second touch electrodes to at least third one of the at least one of the plurality of touch pads, and wherein each of the first, second, and third routing lines is configured by a lower routing line and an upper routing line, and the lower routing line and the upper routing line are electrically connected.

10. The display apparatus according to claim 9, wherein the first routing line is disposed in one side of the non-display area, and the second routing line is disposed in another side of the non-display area, and wherein the another side is different from the one side.

11. The display apparatus according to claim 9, wherein the upper routing line is configured by a process that is same as a process configured at least one of the plurality of first touch electrodes or that is same as a process configured at least one of the plurality of second touch electrodes.

12. The display apparatus according to claim 9, wherein the lower routing line is configured by a process that is same as a process configured at least one of the plurality of first touch connection electrodes.

13. The display apparatus according to claim 12, wherein a height of the lower routing line is equal to a height of the at least one of the plurality of first touch connection electrodes.

14. The display apparatus according to claim 12, wherein a sectional height of the lower routing line is greater than a sectional width of the lower routing line.

15. The display apparatus according to claim 12, wherein a height of the lower routing line is different from a height of at least one of the plurality of first touch electrodes, a height of at least one of the plurality of second touch electrodes, or a height of at least one of the plurality of second touch connection electrodes.

16. The display apparatus according to claim 7, wherein the encapsulation structure includes a first encapsulation layer, a second encapsulation layer, and a third encapsulation layer, and wherein a cross section of each of the substrate, the first encapsulation layer, and the third encapsulation layer is exposed at the cutting surface.

17. The display apparatus according to claim 16, wherein a cross section of each of the first touch buffer layer and the second touch buffer layer or the touch protection layer is exposed at the cutting surface.

18. The display apparatus according to claim 7, wherein the end of the touch insulating layer is spaced apart from the cutting surface by 10 µm or more toward the display area.

19. The display apparatus according to claim 1, wherein the second touch dielectric layer comprises an inorganic material.

20. The display apparatus according to claim 1, wherein in the portion of the non-display area, the routing line is spaced apart from the another routing line along a thickness direction of the routing line.

21. The display apparatus according to claim 1, wherein the another routing line is formed of a same layer and of a same material as the first touch conductive electrode.

22. The display apparatus according to claim 1, wherein:
the first touch conductive electrode comprises a first touch connection electrode;
the second touch conductive electrode is disposed on the first touch connection electrode; and
the another routing line is formed of a same layer and of a same material as the first touch connection electrode.

23. The display apparatus according to claim 1, wherein:
in the portion of the non-display area, a dielectric layer, the routing line, the second touch dielectric layer, and the another routing line are stacked.

24. The display apparatus according to claim 1, wherein:
in the portion of the non-display area, a dielectric layer, the routing line, the second touch dielectric layer, the another routing line, and first touch dielectric layer are stacked.

25. A display apparatus, comprising:
a display area and a non-display area, wherein the non-display area includes a pad area;
a plurality of pixels including a light emitting diode and a transistor in the display area, wherein the light emitting diode comprises a first electrode, an emission element, and a second electrode, and wherein the transistor comprises a gate electrode, a source electrode, and a drain electrode;
an encapsulation structure which is disposed in the display area and a part of the non-display area;
a touch structure, wherein at least a portion of the touch structure is disposed on the encapsulation structure, wherein the touch structure comprises a plurality of touch dielectric layers and a first touch conductive electrode, and wherein the plurality of touch dielectric layers comprises a first touch dielectric layer, a second touch dielectric layer and a third touch dielectric layer;
a routing line disposed in the non-display area;
another routing line disposed in the non-display area; and
a touch pad disposed in the pad area and comprising a first touch pad and a second touch pad,
wherein:
the first and second touch dielectric layers are disposed on the encapsulation structure;
the first touch pad is formed of a same layer and of a same material as the source electrode of the transistor or the drain electrode of the transistor;
the routing line is extended and connected to the second touch pad;
the second touch pad is formed of a same layer and of a same material as the routing line;
at least one of the first and second touch dielectric layers is extended to the pad area and is disposed under the second touch pad;
the second touch pad is disposed on the first touch pad;
the second touch pad is connected to the first touch pad using at least an opening in the at least one of the first and second touch dielectric layers;
the non-display area includes a cutting surface; and
in a portion of the non-display area, the routing line is disposed on the another routing line, and the second and third touch dielectric layers are disposed between the routing line and the another routing line.

* * * * *